United States Patent
Kim et al.

(10) Patent No.: US 8,681,545 B2
(45) Date of Patent: Mar. 25, 2014

(54) METHODS OF PROGRAMMING SEMICONDUCTOR MEMORY DEVICES

(71) Applicant: Samsung Electronics Co., Ltd., Suwon-si (KR)

(72) Inventors: Si-Hwan Kim, Hwaseong-si (KR); Joon-Suc Jang, Hwaseong-si (KR); Duck-Kyeun Woo, Anyang-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/896,141

(22) Filed: May 16, 2013

(65) Prior Publication Data

US 2013/0250680 A1    Sep. 26, 2013

Related U.S. Application Data

(63) Continuation of application No. 12/905,280, filed on Oct. 15, 2010, now Pat. No. 8,446,775.

(30) Foreign Application Priority Data

Nov. 3, 2009    (KR) .................. 10-2009-0105290

(51) Int. Cl.
 *G11C 16/10*    (2006.01)
(52) U.S. Cl.
 USPC ............ 365/185.03; 365/185.19; 365/185.22; 365/185.24

(58) Field of Classification Search
 USPC .............. 365/185.19, 185.22, 185.03, 185.24
 See application file for complete search history.

(56) References Cited

U.S. PATENT DOCUMENTS

| 6,411,551 | B1 | 6/2002 | Kim et al. |
| 7,035,146 | B2 | 4/2006 | Hemink et al. |
| 2008/0253181 | A1* | 10/2008 | Edahiro et al. ........... 365/185.03 |
| 2008/0298124 | A1 | 12/2008 | Wong |

FOREIGN PATENT DOCUMENTS

| JP | 2008-257781 | 1/2008 |
| KR | 100836762 B1 | 6/2008 |
| KR | 1020090042108 A | 4/2009 |

* cited by examiner

*Primary Examiner* — Hoai V Ho
*Assistant Examiner* — Tri Hoang
(74) *Attorney, Agent, or Firm* — Myers Bigel Sibley & Sajovec, P.A.

(57) ABSTRACT

To program a semiconductor memory device, a plurality of target threshold voltage groups are set by dividing target threshold voltages representing states of memory cells. The target threshold voltage groups are substantially simultaneously programmed by applying a plurality of program voltages to a word line. Program end times for the target threshold voltage groups are adjusted.

12 Claims, 9 Drawing Sheets

METHODS OF PROGRAMMING SEMICONDUCTOR MEMORY DEVICES

CROSS-REFERENCE TO RELATED APPLICATION

This application is a continuation of U.S. patent application Ser. No. 12/905,280, filed on Oct. 15, 2010 in the United States Patent and Trademark Office, now U.S. Pat. No. 8,446,375, and claims priority from Korean Patent Application No. 10-2009-0105290, filed on Nov. 3, 2009, in the Korean Intellectual Property Office, the disclosures of which are herein incorporated by reference in their entireties.

TECHNICAL FIELD

The inventive concept relates generally to semiconductor memory devices. More particularly, the inventive concept relates to methods of programming semiconductor memory devices.

BACKGROUND

Semiconductor memory devices may be generally classified as either volatile or nonvolatile memory devices depending on whether the device is capable of retaining data when power to the device power is interrupted.

As the use of mobile devices, such as mobile phones, personal digital assistants (PDA), digital cameras, portable game consoles, MP3 players and the like increases, the use of nonvolatile memory devices as both data storage devices and as code storage devices has also increased. Nonvolatile memory devices are also being used with increased frequency in high definition televisions (HDTV), digital versatile disc (DVD) players, routers, global positioning systems (GPS) and various other applications.

Flash memory devices are one widely used type of nonvolatile memory device. Flash memory devices may be classified as either NOR flash memory devices or NAND flash memory devices based on the connection state of a cell transistor and a bit line. In a NOR flash memory device, two or more cell transistors are connected to one bit line in parallel. In a NAND flash memory device, two or more cell transistors are connected to one bit line in series. A NOR flash memory device can be read by accessing stored data in a byte-by-byte manner, while a NAND flash memory device has a high cell density. As such, NOR flash memory devices are particularly suitable as code storage devices, while NAND flash memory devices are particularly suitable as data storage devices.

The flash memory device in the past was limited to storing only one bit of data per memory cell. Recent technological advances, however, have allowed researchers to develop flash memory devices that store more than one bit of data per memory cell. A flash memory device that stores one bit of data per memory cell is referred to as a single level cell (SLC) device, and a flash memory device that stores more than one bit of data per memory cell is referred to as a multi-level cell (MLC) device. As the demand for small, high density memory devices has increased, MLC devices have been increasingly used in a wide variety of applications. However, since the MLC device stores data based on a plurality of threshold voltages, distributions of the threshold voltages may negatively affect reliability of the MLC device.

SUMMARY

Example embodiments provide a method of programming a semiconductor memory device capable of reducing bit line coupling.

Example embodiments provide a method of programming a semiconductor memory device capable of increasing a program speed.

Example embodiments provide a method of programming a semiconductor memory device capable of improving reliability.

In a method of programming a semiconductor memory device according to example embodiments, a plurality of target threshold voltage groups are set by dividing target threshold voltages representing states of memory cells. This may be accomplished by assigning each target threshold voltage to one of a plurality of target threshold voltage groups.

The target threshold voltage groups are substantially simultaneously programmed by applying a plurality of program voltages to a word line. Program end times for the target threshold voltage groups are adjusted.

The program end times may be adjusted such that program operations for the target threshold voltage groups are finished at the same program loop.

In some embodiments, voltages levels of the target threshold voltages may be adjusted to adjust the program end times.

In other embodiments, time points of application of the program voltages may be adjusted to adjust the program end times.

To adjust the program end times for the target threshold voltage groups, pulse completion signals may be generated. Each pulse completion signal may be generated when the memory cells programmed by a corresponding program voltage among the program voltages are all passed. The program end times may be adjusted based on the pulse completion signals.

In some embodiments, to adjust the program end times based on the pulse completion signals, a voltage level of at least one maximum target threshold voltage may be decreased based on time points of generation of the pulse completion signals. The maximum target threshold voltage may be a target threshold voltage having the highest voltage level among the target threshold voltages included in each target threshold voltage group.

To decrease the voltage level of the at least one maximum target threshold voltage, a voltage level of a verify voltage corresponding to the maximum target threshold voltage may be decreased until the time points of generation of the pulse completion signals become substantially the same.

In other embodiments, to adjust the program end times based on the pulse completion signals, a last pulse completion signal among the pulse completion signals may be detected. The last pulse completion signal may be a pulse completion signal generated later than the other pulse completion signals. Application of at least one of the program voltages may be delayed based on a difference between a time point of generation of the last pulse completion signal and a time point of generation of a corresponding pulse completion signal among the pulse completion signals.

To delay the application of the at least one of the program voltages, a delay time may be calculated based on the difference between the time point of generation of the last pulse completion signal and the time point of generation of the corresponding pulse completion signal. The at least one of the program voltages may be applied after the calculated delay time.

In some embodiments, to adjust the program end times based on the pulse completion signals, program pulses of each program voltage may be counted until a corresponding pulse completion signal among the pulse completion signals is generated. Voltages levels of the target threshold voltages may be adjusted based on the counted program pulses.

In other embodiments, to adjust the program end times based on the pulse completion signals, program pulses of each program voltage may be counted until a corresponding pulse completion signal among the pulse completion signals is generated. Program loops in which the program voltages start to be applied may be set based on the counted program pulses.

In some embodiments, to adjust the program end times, intervals between maximum target threshold voltages and minimum target threshold voltages may be adjusted to be the same. Each maximum target threshold voltage may be a target threshold voltage having the highest voltage level among the target threshold voltages included in each target threshold voltage group. Each minimum target threshold voltage may be a target threshold voltage having the lowest voltage level among the target threshold voltages included in each target threshold voltage group.

The program voltages may have different voltage levels.

In some embodiments, the memory cells may be verified based on verify voltages corresponding to the target threshold voltages. To adjust the program end times for the target threshold voltage groups, a voltage level of at least one of the verify voltages may be adjusted to adjust the program end times.

The memory cells may be multi-level cells for storing a plurality of bits per cell.

Each program voltage may include incremental step pulses that increase per program loop.

In some embodiments, a forcing voltage may be applied to bit lines connected to the memory cells based on the target threshold voltages.

The forcing voltage may be generated based on a difference between a maximum target threshold voltage and a corresponding target threshold voltage among the target threshold voltages. The maximum target threshold voltage may be a target threshold voltage having the highest voltage level among the target threshold voltages included in each target threshold voltage group.

Therefore, a method of programming a semiconductor memory device according to example embodiments can prevent coupling between memory cells.

BRIEF DESCRIPTION OF THE DRAWINGS

Embodiments of the inventive concept are presented below with reference to the accompanying drawings. In the drawings, like reference numbers denote like features.

DETAILED DESCRIPTION OF THE EMBODIMENTS

Figure 1:
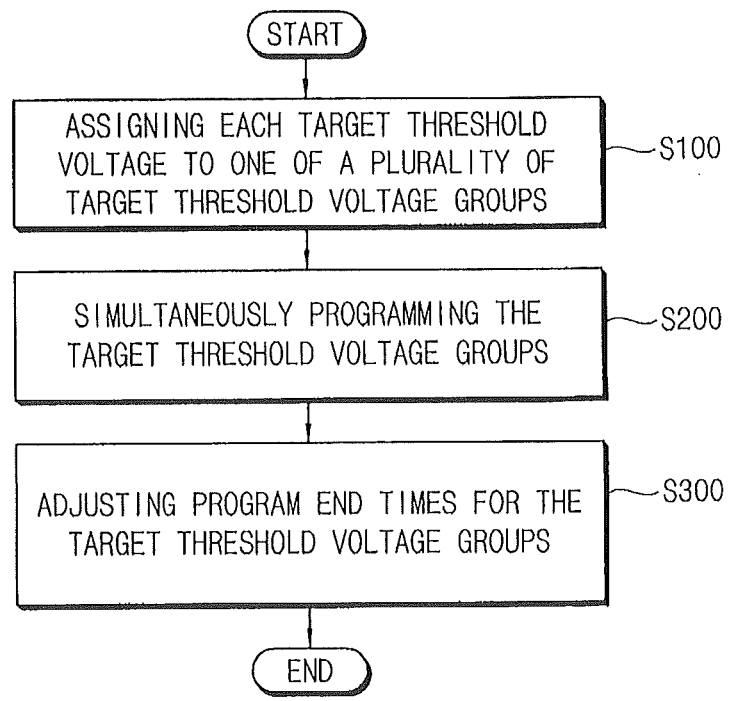
FIG. 1 is a flow chart illustrating a method of programming a semiconductor memory device according to example embodiments.

Detailed example embodiments are disclosed herein. However, specific structural and functional details disclosed herein are merely representative for purposes of describing example embodiments. Thus, it will be understood that example embodiments may be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, the operations listed in two blocks in a flow chart that are shown in succession may in fact be executed substantially concurrently or may sometimes be executed in the reverse order, depending upon the functionality/acts involved.

FIG. 1 is a flow chart illustrating a method of programming a semiconductor memory device according to example embodiments.

Referring to FIG. 1, a plurality of target threshold voltage groups are established or "set" by assigning each of the target threshold voltages that indicate the various memory cell states to one of the plurality of target threshold voltage groups (S100). The target threshold voltages represent desired threshold voltages of memory cells that are to be programmed. Threshold voltages of the memory cells programmed to have the same target threshold voltage may differ over a range because of cell-to-cell variations. If a threshold voltage of a memory cell reaches the target threshold voltage, the memory cell may be determined to be passed by a verify operation.

The target threshold voltage groups are substantially simultaneously programmed by applying a plurality of program voltages to a selected word line (S200). A pass voltage may be applied to non-selected word lines. Each program voltage is used to program a corresponding target threshold voltage group, and the plurality of program voltages may be sequentially applied within each program loop. Each program voltage may include a plurality of program pulses, and may include incremental step pulses that increase by a step voltage as the program loop proceeds. The verify operation may be performed during each program loop by applying verify voltages that correspond to the target threshold voltages after the plurality of program voltages are applied. This verify operation may be used to determine whether the memory cells are passed or failed during each program loop. A program inhibit voltage may be applied to bit lines connected to passed memory cells. Although the program inhibit voltage is applied to the passed memory cells to prevent further programming thereof, threshold voltages of the passed memory cells may still change due to coupling that may occur while adjacent memory cells are programmed. Each program pulse of one program voltage may be applied once per program loop, and a program end time may be obtained by counting the number of program pulses for each program voltage until the memory cells programmed by the program voltage are all passed.

Each program voltage is used to program a corresponding target threshold voltage group that includes a plurality of target threshold voltages, and a program operation for a target threshold voltage group is finished when a program operation for the maximum target threshold voltage having the highest voltage level among the target threshold voltages included in the target threshold voltage group is finished. That is, if memory cells to be programmed to have the maximum target threshold voltage are all passed, the program operation for the target threshold voltage group is finished.

Program end times for the target threshold voltage groups are adjusted (S300). The program end times may be adjusted such that program operations for the target threshold voltage groups are finished during the same program loop. In some embodiments, voltage levels of the target threshold voltages may be adjusted to adjust the program end times. For example, intervals between the target threshold voltages may be adjusted so that the program operations for the target threshold voltage groups are finished during the same program loop. In other embodiments, the time points at which the program voltages are applied may be adjusted to adjust the program end times. For example, program loops at which the program voltages start to be applied may be adjusted so that the program operations for all of the target threshold voltage groups are completed during the same program loop.

Figure 2A:
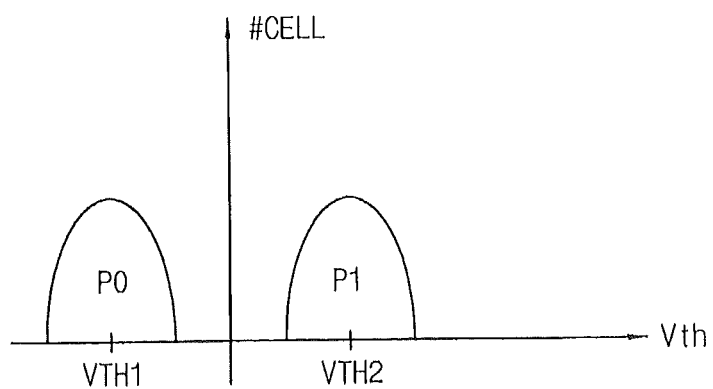
FIGS. 2A and 2B are diagrams illustrating threshold voltage distributions of a nonvolatile memory device.
Figure 2B:
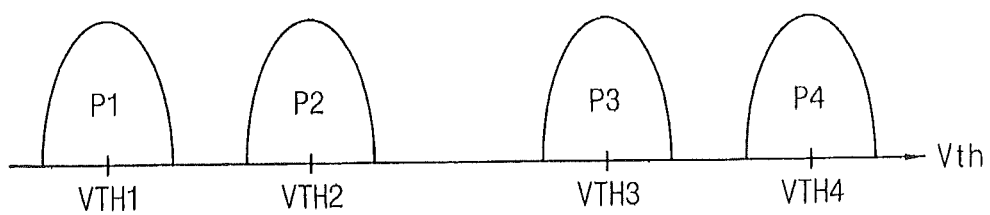

FIGS. 2A and 2B are diagrams for describing a program operation of a nonvolatile memory device. FIG. 2A illustrates an example where single level cells (SLC) which store one bit per memory cell are programmed, and FIG. 2B illustrates an example where multi-level cells (MLC) which store multiple bits per memory cell are programmed.

In FIG. 2A, the horizontal axis represents voltage levels of threshold voltages, and the vertical axis represents the number of memory cells that have each threshold voltage. As shown in FIG. 2A, a memory cell in an erase state P0 may have a first threshold voltage VTH1. The first threshold voltage VTH1 may have a negative value. An erase operation may be performed using Fowler-Nordheim (F-N) tunneling by applying a high positive voltage to a substrate or a well in which the memory cells are formed to remove charges in the charge storing layers of the memory cells. On the other hand, a program operation may be performed by applying a high positive voltage to a word line to store charges in the charge storing layers. A programmed memory cell may have an increased threshold voltage since a programmed memory cell has charges in the charge storing layer. In FIG. 2A, a memory cell that is in a programmed state P1 may have a second threshold voltage VTH2 that is higher than the first threshold voltage VTH1.

As noted above, due to cell-to-cell variations, the memory cells in the erase state P0 and the program state P1 are distributed around the first threshold voltage VTH1 and the second threshold voltage VTH2, respectively. The erase state P0 may be assigned to data "1", and the program state P1 may be assigned to data "0". Thus, each single level cell may store one bit data of value "0" or "1".

Referring to FIG. 2B, each multi-level cell may be in one of first through fourth states P1, P2, P3 and P4. Memory cells in the first through fourth states P1, P2, P3 and P4 are distributed around first through fourth threshold voltage VTH1, VTH2, VTH3 and VTH4, respectively. The states P1, P2, P3 and P4 may be determined according to the amount of charges stored in a charge storing layer. The first state P1 may be assigned to data "00", the second state P2 may be assigned to data "01", the third state P3 may be assigned to data "10", and the fourth state P4 may be assigned to data "11". Thus, each multi-level cell may store two bits of data.

As the number of bits of data stored per memory cell increases, the cell density of a semiconductor memory device increases. However, the reliability of the semiconductor memory device may deteriorate in MLC devices since the intervals between adjacent threshold voltage distributions become narrower as the number of bits of data stored per memory cell increases. Although FIG. 2B illustrates an example where each memory cell stores two data bits, the number of bits stored in one memory cell may be three or more in other embodiments.

Figure 3:
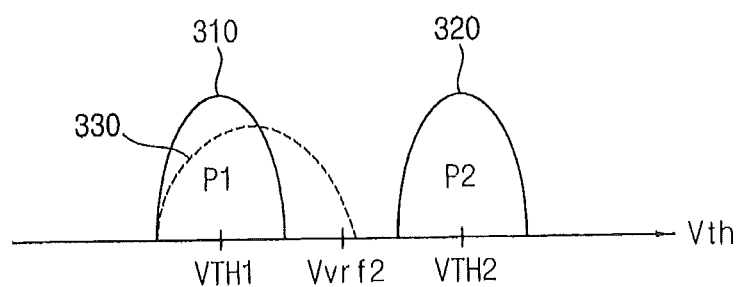
FIG. 3 is a diagram illustrating deterioration of a threshold voltage distribution that may be caused by coupling during a program operation.

FIG. 3 is a diagram for describing how threshold voltage distributions may deteriorate due to coupling during a program operation.

As shown in FIG. 3 if memory cells are programmed to have a first threshold voltage VTH1, the memory cells may have a first threshold voltage distribution 310 after programming is completed. However, if adjacent memory cells are programmed to have a second threshold voltage VTH2 after a program operation for the first threshold voltage VTH1 is finished, the first threshold voltage distribution 310 may be shifted into a second threshold voltage distribution 330 because of coupling during the program operation for the second threshold voltage VTH2. That is, threshold voltages of the memory cells of the first threshold voltage distribution 310 may increase during subsequent programming of adjacent memory cells.

Victim memory cells having the increased threshold voltages may be erroneously determined as being in a state of aggressor memory cells. For example, with reference to FIG. 3, memory cells in the second threshold voltage distribution 330 are expected to be in a first state P1. However, the memory cells of the second threshold voltage distribution 330 having threshold voltages higher than a verify voltage Vvrf2 may be erroneously determined as being in a second state P2. Accordingly, the deterioration of the threshold voltage distribution that may occur because of coupling during subsequent programming of adjacent memory cells may result in a program error, which may negatively affect the reliability of a semiconductor memory device. The coupling for a first memory cell occurs when an adjacent memory cell is programmed after a program operation for the first memory cell is finished. The program error may be more likely to occur in a semiconductor memory device having multi-level cells since the intervals between threshold voltage distributions may be narrower in such devices.

Figure 4A:
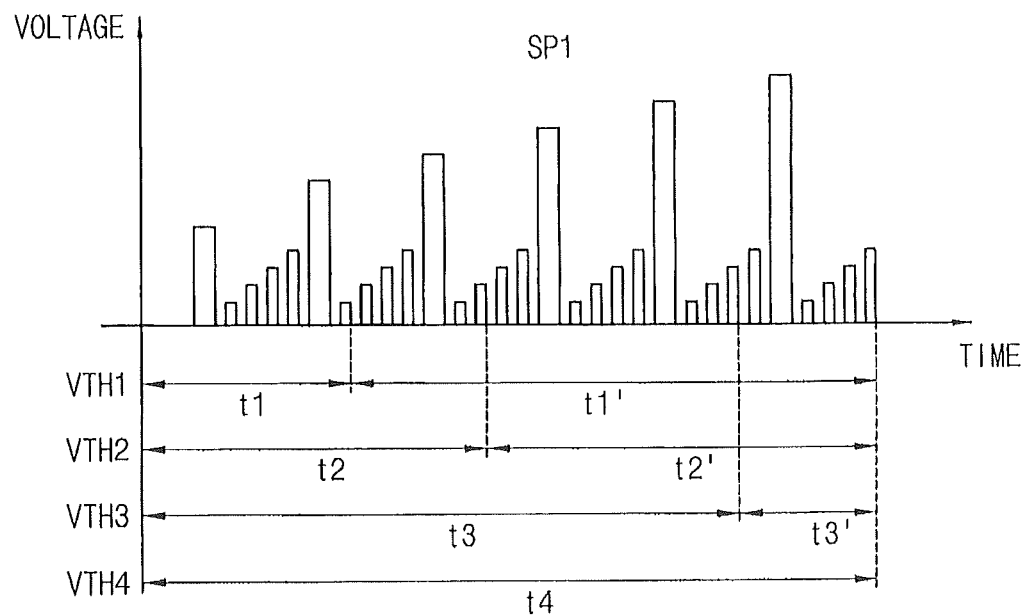
FIGS. 4A and 4B are diagrams for describing program voltages for a program operation and coupling during the program operation.
Figure 4B:
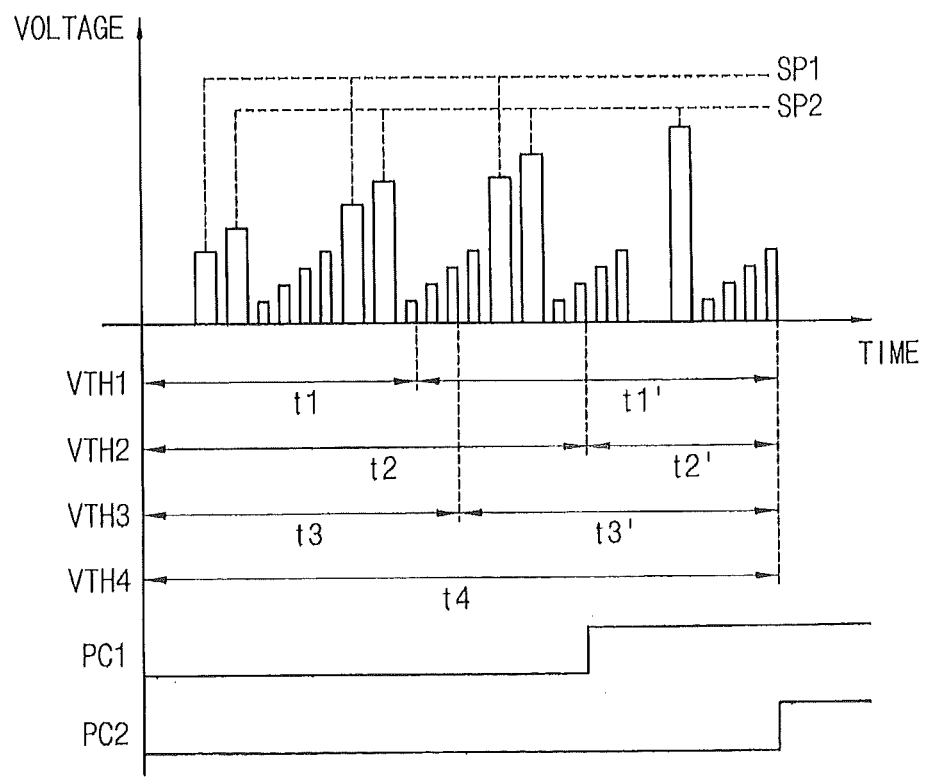

FIGS. 4A and 4B are diagrams for describing program voltages for a program operation and the coupling that may occur during the program operation.

FIG. 4A illustrates an example where four memory cell states are programmed using one program voltage SP1. FIG. 4B illustrates an example where four memory cell states are programmed using two program voltages SP1 and SP2.

Referring to FIG. 4A, a program voltage SP 1 may increase by a step voltage, and may be applied to a selected word line. If memory cells are programmed using incremental step pulses, threshold voltage distribution characteristics of the memory cells may be improved compared to a program operation that uses a program voltage of a fixed voltage level. A program operation using the incremental step pulses may be suitable for programming multi-level cells.

If the memory cells are programmed to have the first threshold voltage VTH1 illustrated in FIG. 2B, the memory cells may be determined to have the first threshold voltage VTH1 by a verify operation after a first time period t1 from the application of the program voltage SP1, and thus a program operation for the first threshold voltage VTH1 may be finished after the first time period t1. Subsequently, the program voltage SP1 may be repeatedly applied to program the memory cells to have second through fourth threshold voltages VTH2, VTH3 and VTH4. A program operation for the second threshold voltage VTH2 may be finished after a second time period t2, a program operation for the third threshold voltage VTH3 may be finished after a third time period t3, and a program operation for the fourth threshold voltage VTH4 may be finished after the fourth time period t4. Thus, the entire program operation may be finished after the fourth time period t4. A program inhibit voltage may be applied to bit lines connected to memory cells that are determined to have been programmed during the program operations (i.e., once the memory cells that are programmed to have the first threshold voltage VTH1 are verified during the verify operation after the first time period t1, then a program inhibit voltage may be applied to these memory cells). However, threshold voltages of the memory cells that are programmed to have the first through third threshold voltages VTH1, VTH2 and VTH3 may be shifted by coupling between adjacent memory cells during the time periods t1', t2' and t3', respectively, which results in above-described deterioration of the threshold voltage distributions of the memory cells that are programmed to have the first through third threshold voltages VTH1, VTH2 and VTH3.

Referring to FIG. 4B, a first program voltage SP1 is applied to program memory cells that are to have the first and second threshold voltages VTH1 and VTH2, and a second, different program voltage SP2 is applied to program the memory cells that are to have the third and fourth threshold voltages VTH3 and VTH4. Although FIG. 4B illustrates an example where each program voltage is used to program two threshold voltages, the number of the threshold voltages programmed by one program voltage may be one or more.

The first and second program voltages SP1 and SP2 may be sequentially activated and applied to a selected word line during each program loop. A program operation for the first threshold voltage VTH1 may be finished after a first time period t1, and a program operation for the third threshold voltage VTH3 may be finished after a third time period t3. As shown in FIG. 4B, the program operations for the first and third threshold voltages VTH1 and VTH3 may be finished during the same program loop (the second program loop in FIG. 4B), and thus the program operations are regarded to be finished at substantially the same time. Subsequently, a program operation for the second threshold voltage VTH2 may be finished after a second time period t2 (during the third program loop), and a program operation for the fourth threshold voltage VTH4 may be finished after a fourth time period t4 (during a fourth program loop).

When the program operations by the first program voltage SP1 are finished (that is, at the end of the second time period t2), a first pulse completion signal PC1 may be generated. When the program operations by the second program voltage SP2 are finished (that is, at the end of the fourth time period t4), a second pulse completion signal PC2 may be generated. The pulse completion signals PC1 and PC2 will be described below.

Compared to FIG. 4A, the time periods t1', t2' and t3' in FIG. 4B during which the threshold voltage distribution characteristics may deteriorate due to coupling, are decreased. Thus, the coupling effect may be reduced by using a multi-pulse program method that applies multiple program voltages per program loop. However, the multi-pulse program method requires multiple voltage generators and multiple voltage control circuits to generate the multiple program voltages.

A pulse group program method will be described below, which may reduce not only the coupling effect caused by differences between program end times, but also the overhead needed to generate the multiple program voltages.

In the present description, a target threshold voltage represents a desired threshold voltage that a memory cell is programmed to have, and target threshold voltages are grouped into at least two target threshold voltage groups. Each program voltage is used to program a corresponding target threshold voltage group that includes at least one target threshold voltage. Each program voltage may include incremental step pulses that sequentially increase by a step voltage, or may include a single pulse. Memory cells that are programmed by the program voltage may include single level cells or multi-level cells.

Figure 5:
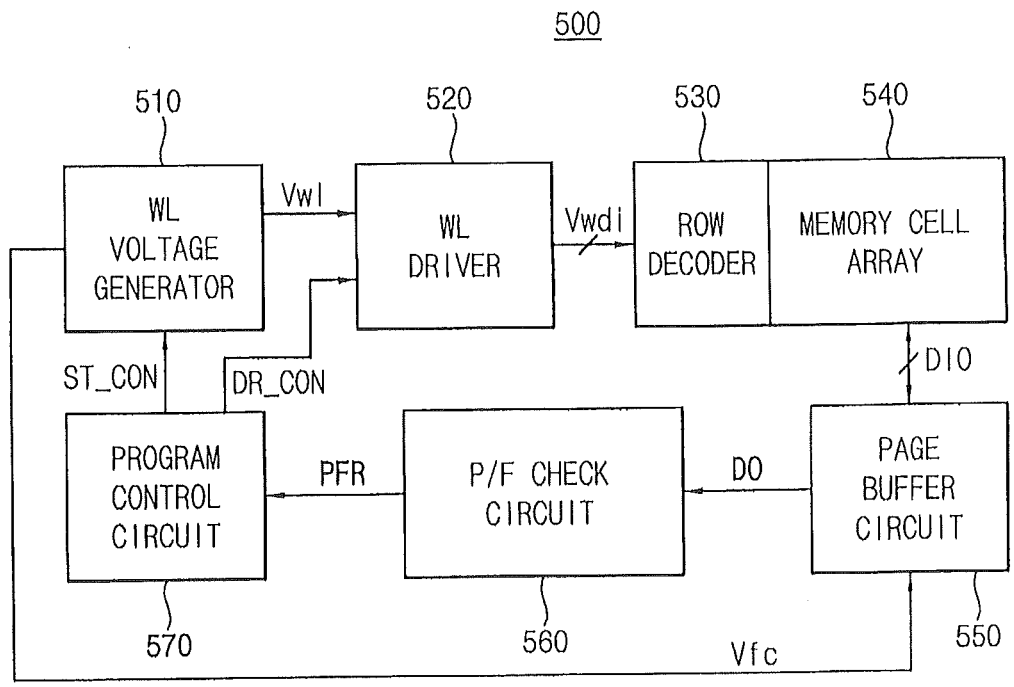
FIG. 5 is a block diagram illustrating a semiconductor memory device performing a program operation according to example embodiments.

FIG. 5 is a block diagram illustrating a semiconductor memory device 500 according to example embodiments.

Referring to FIG. 5, the semiconductor memory device 500 includes a word line voltage generator 510, a word line driver 520, a row decoder 530, a memory cell array 540, a page buffer circuit 550, a pass/fail check circuit 560 and a program control circuit 570.

The word line voltage generator 510 generates word line voltages Vwl that are applied to the word lines according to operations of the semiconductor memory device 500. For example, the word line voltage generator 510 may generate a read voltage during a read operation, a verify voltage during a verify operation, a pass voltage and a program voltage during a program operation, and an erase voltage during an erase operation. Although the read operation and the verify operation may be distinguished according to whether output data are provided to external circuits, the read voltage and the verify voltage may be substantially the same. The word line voltage generator 510 may generate a plurality of program voltages that are applied to a selected word line. Each program voltage may increase per program loop. Each program loop may include a program period in which the program voltages are applied to the selected word line and a verify period in which verify voltages that correspond to respective target threshold voltages are sequentially applied to the selected word line. After each program period, memory cells may be determined to be passed or failed. A program inhibit voltage may be applied to bit lines connected to passed memory cells. The program voltages may be increased by a step voltage as compared to the program voltages that were applied in the previous program loop, and the increased program voltages may be applied to the selected word line.

The word line voltage generator 510 may generate the increased program voltages based on a state control signal ST_CON that is received from a program control circuit 570. The word line voltage generator 510 may cease generating each program voltage after the program operation for the program voltage is finished. Once a target threshold voltage is set to decrease, the word line voltage generator 510 may generate a decreased verify voltage corresponding to the decreased target threshold voltage.

The word line driver 520 may adjust time points at which the word line voltages Vwl are applied to the row decoder 530 in response to a driving control signal DR_CON. The program voltages may all be applied at the same start time or, alternatively, the program voltages may be applied at different start times based on the program end times for the program voltages. For example, the start time for an applied program voltage that has a program end time that is earlier than the other program end times may be delayed based on the driving control signal DR_CON. The word line driver 520 provides word line driving voltages Vwdi to the row decoder 530 based on the word line voltages Vwl and the driving control signal DR_CON.

The row decoder 530 provides the word line driving voltages Vwdi to the memory cell array 540. The row decoder 530 may receive a row address signal from an address buffer circuit (not shown), and may apply the word line driving voltages Vwdi to corresponding word lines based on the row address signal.

The memory cell array 540 includes a plurality of memory cells. The memory cells may have various structures (e.g., NAND type flash memory cells, NOR-type flash memory cells, etc.) based on the type of memory device. The memory cells may be programmed based on the word line driving voltages Vwdi from the row decoder 530 and bit line voltages from the page buffer circuit 550.

The page buffer circuit 550 may include a plurality of page buffers, which are connected to the respective bit lines of the memory cell array 540. The page buffer circuit 550 may transmit or receive a data input/output signal DIO, and may operate as a write driver or a sense amplifier according to an operating mode of the semiconductor memory device 500.

During the program operation, program data or a forcing voltage Vfc may be applied to the bit lines that are connected to the memory cells that are to be programmed, and a program inhibit voltage may be applied to the bit lines that are connected to the memory cells that are not to be programmed. The forcing voltage Vfc may be generated based on a difference between target threshold voltages included in one target threshold voltage group. For example, when the first program voltage SP1 illustrated in FIG. 4B is applied to program a first threshold voltage VTH1 and a second threshold voltage VTH2, the forcing voltage Vfc having a voltage level corresponding to a voltage level difference between the first threshold voltage VTH1 and the second threshold voltage VTH2 may be applied to the bit lines connected to the memory cells that are programmed to have the first threshold voltage VTH1. Program operations for one target threshold voltage group may be finished at substantially the same time or at the same program loop by applying the forcing voltage Vfc. The forcing voltage Vfc may be generated by the word line voltage generator 510 based on the state control signal ST_CON from the program control circuit 570, and may be applied to corresponding bit lines through the page buffer circuit 550.

When the memory cells are verified by the verify voltages during the program operation, the page buffer circuit 500 may operate as sense amplifiers that read data through the bit lines. The verify voltages may be different from each other, and may be sequentially applied to verify whether the memory cells are passed or failed during each program period.

The pass/fail check circuit 560 receives a data output signal DO from the page buffer circuit 550. The data output signal DO may include a plurality of bits that are sensed when the verify voltage is applied to the memory cells connected to the same word line. The pass/fail check circuit 560 may provide a pass/fail result signal PFR to the program control circuit 570 by determining whether each memory cell is passed or failed based on the verify voltage.

The pass/fail check circuit 560 may determine whether the memory cells are passed or failed in a column-scan manner or a wired-OR manner by including logic gates. Further, the pass/fail check circuit 560 may simultaneously perform parallel operations of the pass/fail determination for a plurality of target threshold voltages. Thus, the verify operation may be quickly completed by simultaneously performing the operations of the pass/fail determination for the different target threshold voltages.

The program control circuit 570 generates a pulse completion signal for each target threshold voltage groups based on the pass/fail result signal PFR. The program control circuit 570 may generate each pulse completion signal when memory cells programmed to have the maximum target threshold voltage included in a corresponding target threshold voltage group have all passed. If the memory cells programmed to have the maximum target threshold voltage have all passed, all memory cells programmed by a corresponding program voltage are passed. However, even if memory cells programmed by a first program voltage are all passed, memory cells programmed by another program voltage may still be failed. If a program operation continues in order to program such failed memory cells, threshold voltages of the passed memory cells may be unintentionally shifted. However, a program method according to example embodiments may adjust voltage levels of the target threshold voltages or time points of application of the program voltages so that the program operations are finished at substantially the same time, or at the same program loop.

In some embodiments, the program control circuit 570 may adjust the maximum target threshold voltages respectively included in the target threshold voltage groups based on the generation of the pulse completion signals. The program control circuit 570 may provide the word line voltage generator 510 with the state control signal ST_CON indicating the adjusted maximum target threshold voltages to adjust the verify voltage or the program voltage. If the maximum target threshold voltages are adjusted, the times or "time points" at which the pulse completion signals are generated may be changed. Thus, to generate the pulse completion signals at substantially the same time, or at the same program loop, the maximum target threshold voltages other than the maximum target threshold voltage corresponding to a first generated pulse completion signal of the pulse completion signals may be set to decrease. If the maximum target threshold voltages are set to decrease, corresponding verify voltages may also be set to decrease. The setting operations for the maximum target threshold voltages may be repeatedly performed until all the pulse completion signals are generated at substantially the same time, or at the same program loop. Accordingly, all the program operations by the program voltages are finished at substantially the same time, or at the same program loop, thereby reducing the characteristic deterioration of the threshold voltage distributions caused by the coupling.

In other embodiments, the program control circuit 570 may generate the driving control signal DR_CON based on the pass/fail result signal PFR, and may provide the word line driver 520 with the driving control signal DR_CON to adjust the time points at which the word line voltages Vwl are applied to the row decoder 530. For example, the program control circuit 570 may compare the time points at which the pulse completion signals are generated. The comparison of the time points may be performed by a timer, or may be performed by counting the number of applied program pulses for each program voltage. The number of the applied program pulses included in a program voltage may be the same as the number of the program loops in which the program voltage is applied. Here, a pulse completion signal that is generated later than any other pulse completion signal may be referred to as a last pulse completion signal. The program control circuit 570 may calculate delay times based on differences between the time point of generation of the last pulse completion signal and the time point of generation of the other pulse completion signals, and may provide the word line driver 520 with the driving control signal DR_CON including the calculated delay times. Based on the driving control signal DR_CON, the word line driver 520 may provide to the row decoder 530 with the program voltages after the calculated delay times. Accordingly, the program operations for the target threshold voltage groups corresponding to the respective program voltages can be finished at substantially the same time (or at the same program loop) by adjusting the time points at which the program voltages start to be applied to the selected word line, instead of by adjusting the voltage levels of the target threshold voltages.

By such a method of adjusting the time points at which the program voltages start to be applied, the program end times for the target threshold voltage groups may become substantially the same. However, since each program voltage is used to program one target threshold voltage group including at least one target threshold voltage, program operations within a target threshold voltage group may be finished at different times, or at different program loops. In this case, the forcing voltage may be applied so that the program operations within a single target threshold voltage group may be finished at substantially the same time, or at the same program loop.

The word line voltage generator 510 may generate the forcing voltage Vfc based on the state control signal ST_CON that sets the target threshold voltages, and may provide the forcing voltage Vfc to the page buffer circuit 550. The forcing voltage Vfc may finely adjust program end times for the respective target threshold voltages. The forcing voltage Vfc may be provided to the bit lines before the program voltages are applied to the selected word line, and thus the program operations for the target threshold voltages within a particular target threshold voltage group are finished at substantially the same time. Accordingly, the characteristic deterioration of the threshold voltage distributions caused by the coupling may be reduced.

Figure 6:
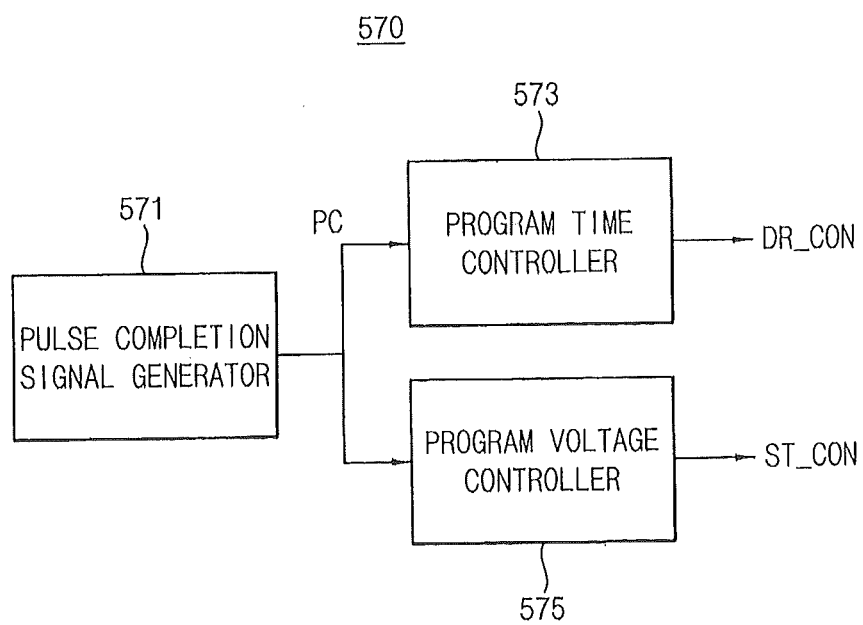
FIG. 6 is a block diagram illustrating an embodiment of the program control circuit that is included in a semiconductor memory device of FIG. 5.

FIG. 6 is a block diagram illustrating an embodiment of a program control circuit that may be used as the program control circuit 570 in the semiconductor memory device 500 of FIG. 5.

Referring to FIG. 6, a program control circuit 570 includes a pulse completion signal generator 571, a program time controller 573 and a program voltage controller 575.

The pulse completion signal generator 571 generates pulse completion signals PC based on a pass/fail result signal PFR. The pulse completion signal generator 571 may generate each completion signal PC when a program operation for a corresponding target threshold voltage group is finished. The number of the generated pulse completion signals PC may be equal to the number of program voltages, which may be the same as the number of target threshold voltage groups.

The program time controller 573 generates a driving control signal DR_CON based on the pulse completion signals PC. The driving control signal DR_CON may be generated based on time points of generation of the pulse completion signals PC, and may be provided to a word line driver 530 illustrated in FIG. 5 to adjust time points at which the program voltages start to be applied to a selected word line. The program time controller 573 may detect the time points of generation of the pulse completion signals PC by using a timer or by counting the number of applied program pulses.

The program voltage controller 575 generates a state control signal ST_CON based on the pulse completion signals PC. The program voltage controller 575 may detect a target threshold voltage group of which a pulse completion signal PC is generated later than the other pulse completion signals PC, and may generate the state control signal ST_CON to set at least one target threshold voltage included in the target threshold voltage group to be decreased. The state control signal ST_CON may be provided to a word line voltage generator 510 illustrated in FIG. 5 to decrease at least one corresponding verify voltage. By setting the target threshold voltage to be decreased, a program operation for the target threshold voltage group may be finished at a desired time point, and thus program operations for all target threshold voltage groups may be finished at substantially the same time, or at the same program loop. If the maximum target threshold voltage included in one target threshold voltage group is decreased by decreasing a corresponding verify voltage, a pulse completion signal corresponding to the target threshold voltage group may be generated earlier. Adjusting the verify voltage may be repeated until the program operations for all the threshold voltage groups are finished at substantially the same time, or at the same program loop. Further, the state control signal ST_CON may be provided to the word line voltage generator 510 to generate a forcing voltage so that program operations of one target threshold voltage group may be finished at substantially the same time.

Figure 7:
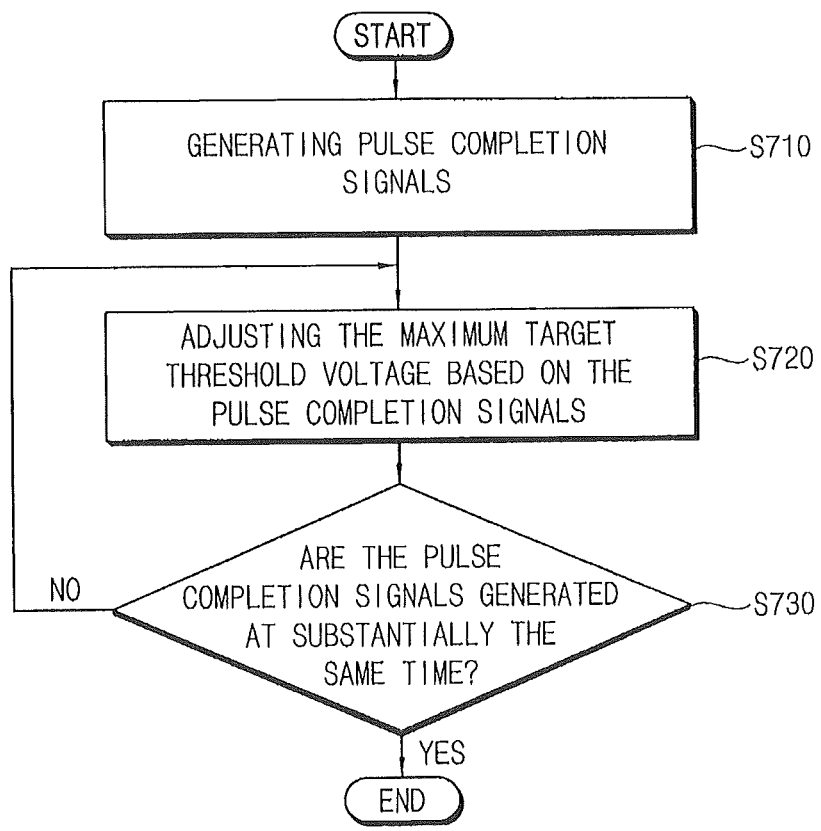
FIG. 7 is a flow chart illustrating a method of adjusting program end times according to example embodiments.

FIG. 7 is a flow chart illustrating a method of adjusting program end times according to example embodiments. A program method including the method of adjusting the program end times according to some example embodiments will be described below with reference to FIGS. 1 and 5 through 7.

Each pulse completion signal is generated when memory cells programmed by a corresponding program voltage are all passed (S710). Each program voltage is used to program a corresponding target threshold voltage group that includes at least one target threshold voltage. Program voltages may be generated by the word line voltage generator 510 based on a state control signal ST_CON.

A plurality of word line driving voltages Vwdi that include the program voltages are generated based on the state control signal ST_CON, and are applied to program the memory cell array 540. A pass/fail result signal PFR may be generated whenever a verify operation is performed during each program loop. A program control circuit 570 may generate one pulse completion signal PC per target threshold voltage group based on the pass/fail result signal PFR. Each pulse completion signal PC may be generated when the threshold voltages of all of the memory cells that are programmed by a corresponding program voltage reach the target threshold voltages included in a corresponding target threshold voltage group. The threshold voltages of all the memory cells programmed by the corresponding program voltage may reach the target threshold voltages when a program operation for the maximum target threshold voltage included in the corresponding target threshold voltage group is finished.

The program control circuit 570 may adjust voltage levels of the target threshold voltages or time points of application of the program voltages based on the pulse completion signals PC. In some embodiments, the maximum target threshold voltage of the target threshold voltage group that corresponds to the last pulse completion signal may be set to decrease (S720). If the maximum target threshold voltage of the target threshold voltage group that corresponds to the last pulse completion signal is set to decrease, or if a verify voltage corresponding to that maximum target threshold voltage is set to decrease, the last pulse completion signal may be generated earlier. If time points of generation of all the pulse completion signals are substantially the same, or occur during the same program loop (S730: YES), the method of adjusting the program end times is finished. If the time points of generation of all the pulse completion signals differ, block S270 may be repeated to further decrease the maximum target threshold voltage of the target threshold voltage group that corresponds to the last pulse completion signal.

Figure 8:
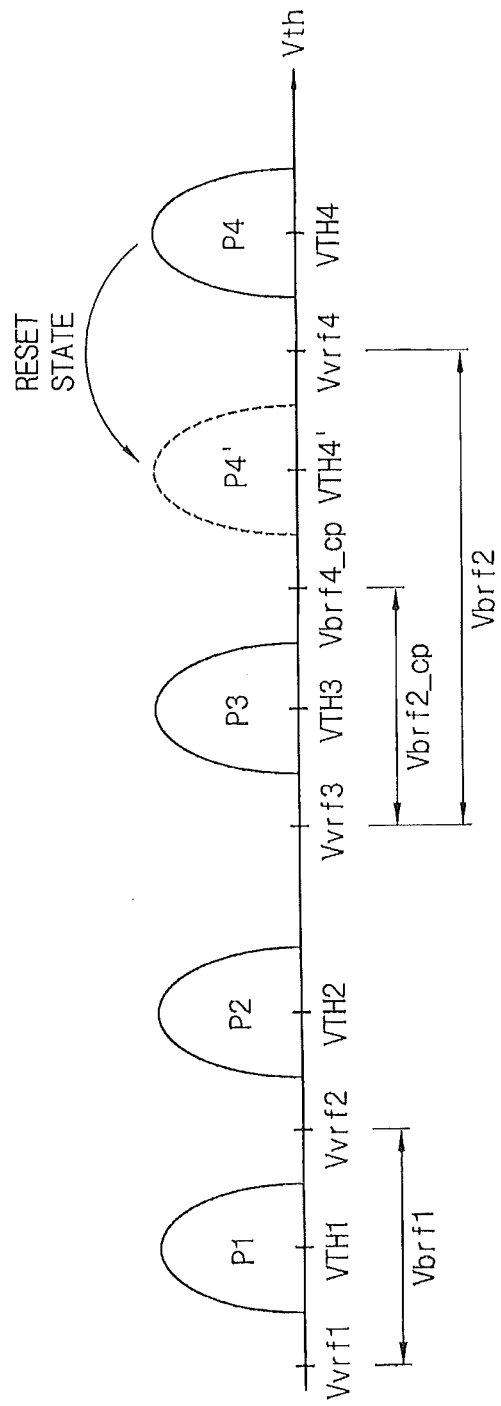
FIG. 8 is a diagram for describing the method of adjusting program end times illustrated in FIG. 7.

FIG. 8 is a diagram for describing the method of adjusting program end times illustrated in FIG. 7.

Referring to FIG. 8, a first state P1 and a second state P2 are programmed by a first program voltage, and a third state P3 and a fourth state P4 are programmed by a second program voltage. A voltage difference Vbrf1 between the first and second verify voltages Vvrf1 and Vvrf2 for verifying the first and second states P1 and P2 may be smaller than a voltage difference Vbrf2 between the third and fourth verify voltages Vvrf3 and Vvrf4 for verifying the third and fourth states P3 and P4. A program operation of the first program voltage may be finished earlier than that of the second program voltage, and thus a first pulse completion signal for the first program voltage may be generated earlier than a second pulse completion signal for the second program voltage.

A program voltage controller may adjust the maximum target threshold voltages of the first and second program voltages based on the first and second pulse completion signals. For example, the program voltage controller may decrease a fourth threshold voltage VTH4 that is the maximum target threshold voltage programmed by the second program voltage having the last generated pulse completion signal. The fourth threshold voltage VTH4 may be repeatedly decreased until the first pulse completion signal and the second pulse completion signal are generated at substantially the same time. In some embodiments, the maximum target threshold voltages may be decreased such that the voltage difference Vbrf2 between the third and fourth verify voltages Vvrf3 and Vvrf4 becomes substantially the same as the voltage difference Vbrf1 between the first and second verify voltages Vvrf1 and Vvrf2. In this case, a voltage difference Vbrf2_cp between the third verify voltage Vvrf3 and an adjusted verify voltage Vvrf4_cp may be substantially the same as the voltage difference Vbrf1 between the first and second verify voltages Vvrf1 and Vvrf2.

Figure 9:
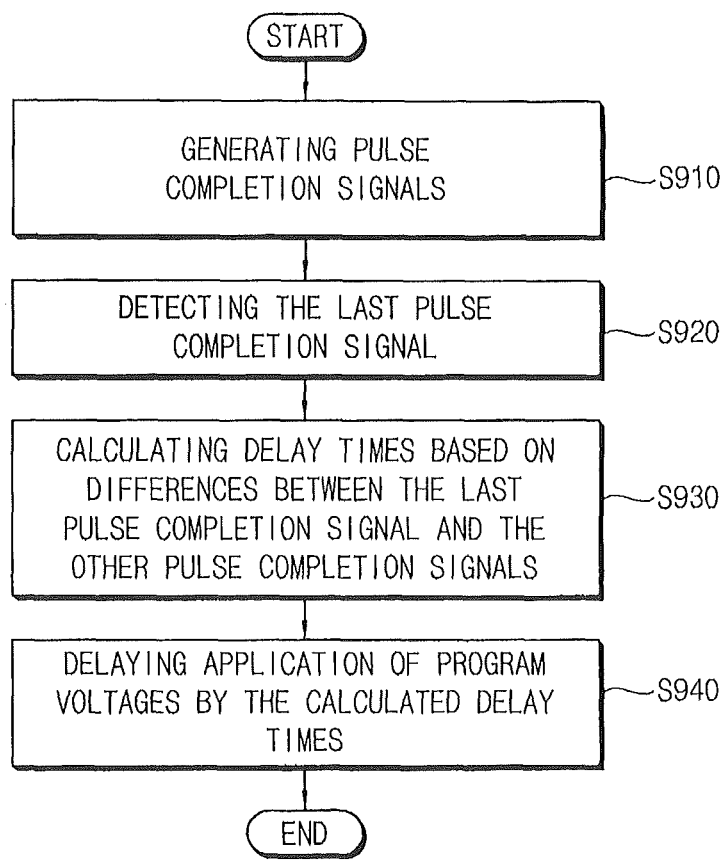
FIG. 9 is a flow chart illustrating a method of adjusting program end times according to example embodiments.

FIG. 9 is a flow chart illustrating another method of adjusting program end times according to example embodiments.

A program method including the method of adjusting the program end times according to some example embodiments will be described below with reference to FIGS. 1, 5, 6 and 9.

Each pulse completion signal PC is generated when memory cells programmed by a corresponding program voltage are all passed (S910).

A program time controller 573 included in the program control circuit 570 detects time points of generation of pulse completion signals PC, and detects the last pulse completion signal that is generated later than all of the other pulse completion signals (S920).

The program time controller 573 may delay time points at which certain of the program voltages are applied based on time point differences between generation of the last pulse completion signal and generation of the other pulse completion signals. Even if a read margin is not enough to adjust voltage levels of target threshold voltages, program operations can be finished at substantially the same time by adjusting the time points of application of the program voltages as illustrated in FIG. 9, instead of by adjusting the voltage levels of the target threshold voltages as illustrated in FIG. 7.

The program time controller 573 may calculate the delay times based on differences between a time point of generation of the last pulse completion signal and time points of generation of the other pulse completion signals (S930). The program voltages are delayed by the calculated delay times, and then the delayed program voltages are applied to a memory cell array 540 (S940).

Figure 10:
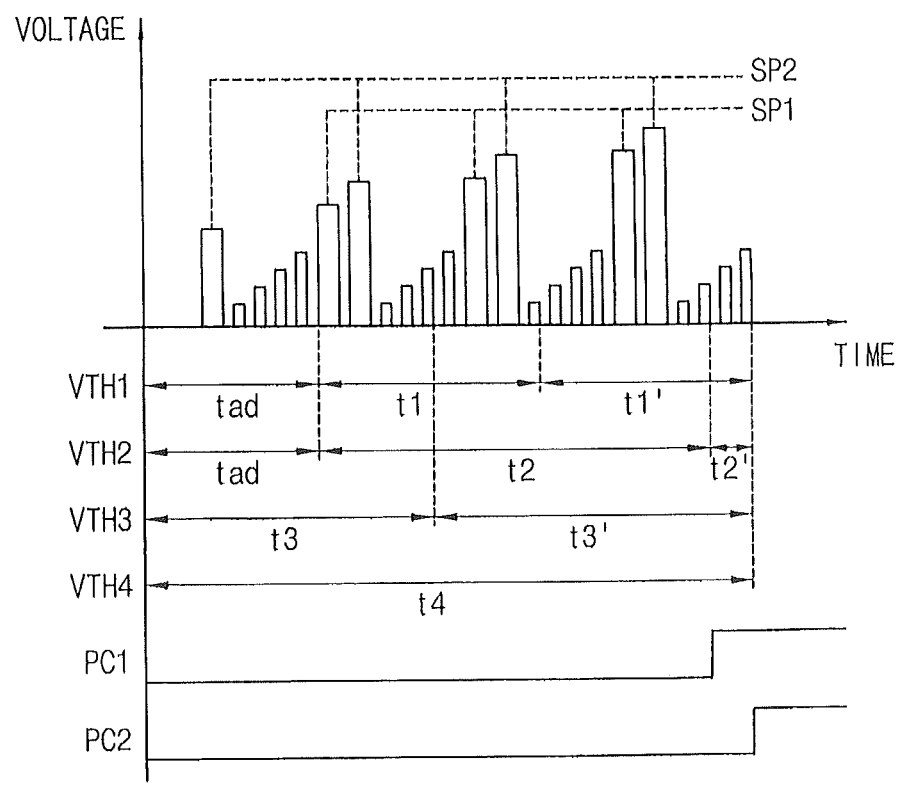
FIG. 10 is a diagram for describing the method of adjusting program end times illustrated in FIG. 9.

FIG. 10 is a diagram for describing the method of adjusting program end times illustrated in FIG. 9.

In FIG. 4B, first and second pulse completion signals PC1 and PC2 are generated at different times. However, in FIG. 10, since a start time at which the first program voltage SP 1 is applied is delayed by a delay time tad, the first and second pulse completion signals PC1 and PC2 are generated within the same program loop (i.e., at substantially the same time).

Since the second pulse completion signal PC2 is generated later than the first pulse completion signal PC1 in FIG. 4B, the second pulse completion signal PC2 may be detected as the last pulse completion signal, and the pulse completion signal PC1 other than the last pulse completion signal PC2 may be delayed by the delay time tad.

That is, the first program voltage SP1 may be applied to a selected word line later than the second program voltage SP2 by the delay time tad. Such delayed application may be controlled by a driving control signal. The delay time may be calculated by counting program loops. For example, in FIG. 4B, since the first pulse completion signal PC1 is generated in the third program loop and the second pulse completion signal PC2 is generated in the fourth program loop, the first program voltage SP1 may be delayed by the delay time tad corresponding to one program loop so that the first and second pulse completion signals PC1 and PC2 may be generated in the same (fourth) program loop as illustrated in FIG. 10.

As described above, the first program voltage SP1 may be delayed by the delay time tad, and thus the first and second pulse completion signals PC1 and PC2 are generated during the same program loop, and hence the program operations for both target threshold voltage groups may be completed at substantially the same time.

Figure 11:
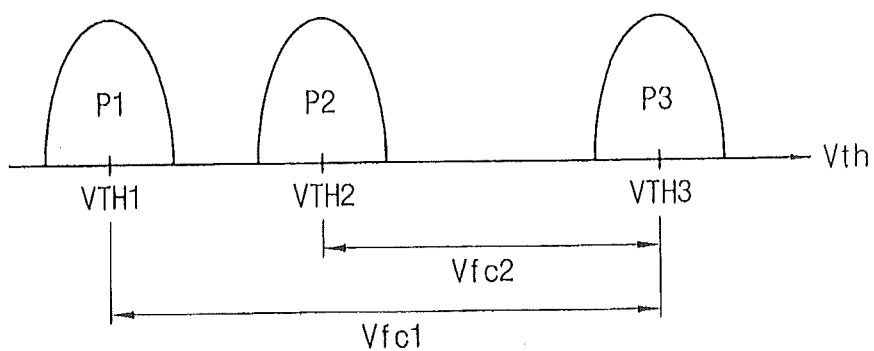
FIG. 11 is a diagram for describing a method of programming a semiconductor memory device according to example embodiments

FIG. 11 is a diagram for describing a method of programming a semiconductor memory device according to example embodiments.

By adjusting voltage levels of target threshold voltages or time points of application of program voltages, program operations for the different target threshold voltage groups may be finished at substantially the same time (i.e., within the same program loop), thereby reducing coupling between the target threshold voltage groups. However, a program voltage corresponding to one target threshold voltage group may program at least one target threshold voltage, and program operations for target threshold voltages included in one target threshold voltage group may be finished at different times if the target threshold voltage group includes two or more target threshold voltages. In this case, coupling may occur between memory cells programmed to the target threshold voltages that are included in the target threshold voltage group.

In FIG. 11, if first through third states P1, P2 and P3 are programmed by one program voltage (in other words, if first through third target threshold voltages VTH1, VTH2 and VTH3 are included in one target threshold voltage group), program operations for the first through third states P1, P2 and P3 may not finish at the same time.

First and second forcing voltages Vfc1 and Vfc2 may be applied to the bit lines that are connected to memory cells that are programmed to the first and second states P1 and P2 to delay program end times, respectively. The first forcing voltage Vfc1 may correspond to a difference between the third target threshold voltage VTH3 and the first target threshold voltage VTH1, and the second forcing voltage Vfc2 may correspond to a difference between the third target threshold voltage VTH3 and the second target threshold voltage VTH2.

If the first and second forcing voltages Vfc1 and Vfc2 are applied, program operations for the first through third target threshold voltages VTH1, VTH2 and VTH3 may be finished when a program operation for the third target threshold voltage VTH3, which is the maximum target threshold voltage, is finished. Thus, the program operations for the first through third target threshold voltages VTH1, VTH2 and VTH3 may be completed at substantially the same time.

Therefore, the program operations for each of the different target threshold voltages that are programmed using the same program voltage may be finished at substantially the same time, and thus all program operations may be finished at substantially the same time.

Figure 12:
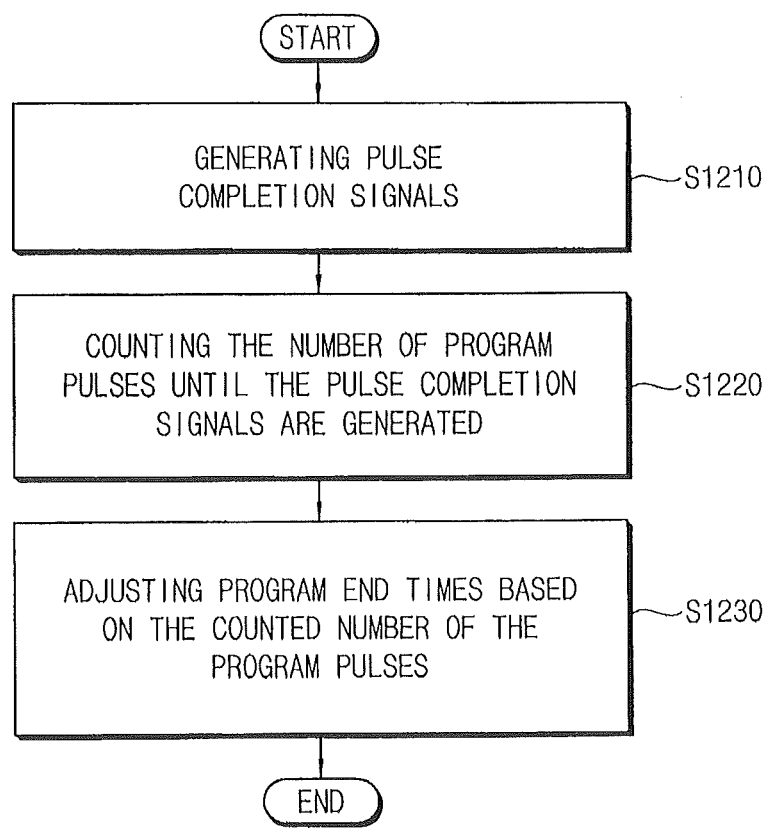
FIG. 12 is a flow chart illustrating a method of adjusting program end times according to example embodiments.

FIG. 12 is a flow chart illustrating a method of adjusting program end times according to example embodiments.

If memory cells programmed by a program voltage are all passed, a corresponding pulse completion signal is generated (step S1210). With respect to each program voltage, the number of program pulses is counted until the corresponding pulse completion signal is generated (step S1220). The counting operations may be performed by a program control circuit 570 illustrated in FIG. 5.

For example, referring to FIG. 4B, three program pulses are applied with respect to a first program voltage SP1 until a first pulse completion signal PC1 is generated, and four program pulses are applied with respect to a second program voltage SP2 until a second pulse completion signal PC2 is generated.

Since the number of program pulses for the first program voltage SP1 is different from the number of program pulses for the second program voltage SP2, program end times for target threshold voltage groups may be adjusted so that the pulse completion signals PC1 and PC2 are generated at substantially the same time (step S1230). The program end times may be adjusted by adjusting voltage levels of target threshold voltages or by adjusting a program loop in which each program voltage SP1 and SP2 starts to be applied.

In a method of adjusting the voltage levels of the target threshold voltages according to some example embodiments, for example, voltage levels of target threshold voltages programmed by the first program voltage SP1 may be decreased so that the number of program loops in which the first program voltage SP1 is applied may become four. In other examples, voltage levels of target threshold voltages programmed by the second program voltage SP2 may be increased so that the number of program loops in which the second program voltage SP2 is applied may become three.

In some embodiments, adjusting the voltage levels of the target threshold voltages may be performed by adjusting the maximum target threshold voltages. As illustrated in FIG. 8, by adjusting the target threshold voltages, intervals between verify voltages may become substantially the same.

In a method of adjusting the program loop in which each program voltage starts to be applied according to some example embodiments, for example, since three program pulses are applied with respect to the first program voltage SP1 until the first pulse completion signal PC1 is generated, and four program pulses are applied with respect to the second program voltage SP2 until the second pulse completion signal PC2 is generated, the start time for application of the first program voltage SP1 may be adjusted to occur one program loop after the start time for application of the second program voltage SP2 so that both the first and second pulse completion signals PC1 and PC2 may be generated during the same program loop.

In some embodiments, a forcing voltage may be applied to reduce coupling within each target threshold voltage group.

In a method of programming a semiconductor memory device according to some example embodiments, threshold voltages of target threshold voltages or time points of application of program voltages may be adjusted so that program operations may be finished at substantially the same time, or at the same program loop. Accordingly, deterioration of the threshold voltage distributions caused by the coupling may be reduced.

As described above, to adjust program end times for target threshold voltage groups, verify voltages corresponding to the maximum target threshold voltages may be adjusted, and/or time points at which program voltages start to be applied may be adjusted.

Not only the program end times for target threshold voltage groups, but also the program end times for each target threshold voltage group may be adjusted by applying a forcing voltage to bit lines through a page buffer circuit. Accordingly, coupling between memory cells programmed by the same program voltage may be reduced, thereby improving threshold voltage distribution characteristics.

The program method according to some example embodiments may be applied to semiconductor memory devices or computing systems packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

The program method according to some example embodiments may be applied to semiconductor memory devices requiring high reliability since the program method may improve the reliability by narrowing threshold voltage distributions. Further, program method according to some example embodiments may be applied to semiconductor memory devices requiring low power consumption and small size since the program method may be operated at low voltage by improving threshold voltage distribution characteristics.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A nonvolatile semiconductor memory device, comprising:
    a memory cell array including a first memory cell group to be programmed to a first target threshold voltage and a second memory cell group to be programmed to a second target threshold voltage; and
    a program control circuit configured to perform a program operation comprising a series of program loops wherein both of the first and second program voltages are applied to respective ones of the first and second memory cell groups in at least one of the program loops and further configured to control the first and second program voltages provided to the memory cell array such that a first time point at which the first program voltage starts to be applied to the first memory cell group during the program operation is later than a second time point at which the second program voltage starts to be applied to the second memory cell group during the program operation when the second target threshold voltage is higher than the first target threshold voltage.

2. The nonvolatile semiconductor memory device of claim 1, wherein the first program voltage increases by a first predetermined step voltage as the program operation proceeds, and wherein the second program voltage increases by a second predetermined step voltage as the program operation proceeds.

3. The nonvolatile semiconductor memory device of claim 1, wherein, when the second target threshold voltage is higher than the first target threshold voltage, the first program voltage starts to be applied after at least one program loop from when the second program voltage starts to be applied to the second memory cell group.

4. The nonvolatile semiconductor memory device of claim 1, wherein the first target threshold voltage includes a third target threshold voltage and a fourth target threshold voltage higher than the third target threshold voltage,
    wherein the first memory cell group includes a plurality of first memory cells that are to be programmed to the third target threshold voltage and a plurality of second memory cells that are to be programmed to the fourth target threshold voltage, and
    wherein a forcing voltage is applied to the plurality of first memory cells.

5. The nonvolatile semiconductor memory device of claim 4, wherein the forcing voltage is generated based on a difference between the third target threshold voltage and the fourth target threshold voltage.

6. The nonvolatile semiconductor memory device of claim 1, wherein program operations for the first and second memory cell groups are completed during the same program loop.

7. The nonvolatile semiconductor memory device of claim 1, wherein the program control circuit generates a first pulse completion signal for the first memory cell group and a second pulse completion signal for the second memory cell group, and adjusts at least one of the first time point and the second time point based on the first and second pulse completion signals.

8. The nonvolatile semiconductor memory device of claim 7, wherein a difference between the first time point and the second time point is determined based on a difference between a time point of generation of the first pulse completion signal and a time point of generation of the second pulse completion signal.

9. A nonvolatile semiconductor memory device, comprising:
    a memory cell array including a first memory cell group to be programmed to a first target threshold voltage and a second memory cell group to be programmed to a second target threshold voltage; and
    a program control circuit configured to generate a first pulse completion signal for the first memory cell group and a second pulse completion signal for the second memory cell group, and to control first and second program voltages provided to the first and second memory cell groups based on the first and second pulse completion signals such that a first time point at which the first program voltage starts to be applied to the first memory cell group is delayed compared to a second time point at which the second program voltage starts to be applied to the second memory cell group when the second pulse completion signal is generated after the first pulse completion signal is generated.

10. A nonvolatile semiconductor memory device, comprising:
    a memory cell array including a first memory cell group to be programmed to a first target threshold voltage and a second memory cell group to be programmed to a second target threshold voltage; and
    a program control circuit configured to perform a program operation comprising a series of program loops wherein first and second program voltages are applied to respective ones of the first and second memory cell groups in at least one of the program loops and further configured to configured to control first and second program voltages provided to the memory cell array such that a first time point at which the first program voltage starts to be applied to the first memory cell group during the program operation is different from a second time point at which the second program voltage starts to be applied to the second memory cell group during the program operation.

11. The nonvolatile semiconductor memory device of claim 10, wherein, when the second target threshold voltage is higher than the first target threshold voltage, the first time point at which the first program voltage starts to be applied to the first memory cell group is later than the second time point at which the second program voltage starts to be applied to the second memory cell group.

12. The nonvolatile semiconductor memory device of claim 10, wherein, when the second target threshold voltage is higher than the first target threshold voltage, the second time point at which the second program voltage starts to be applied to the second memory cell group is later than the first time point at which the first program voltage starts to be applied to the first memory cell group.

* * * * *